US008153079B2

(12) United States Patent
Yamakawa et al.

(10) Patent No.: US 8,153,079 B2
(45) Date of Patent: *Apr. 10, 2012

(54) MICROFLUIDIC APPARATUS WITH INTEGRATED POROUS-SUBSTRATE/SENSOR FOR REAL-TIME (BIO)CHEMICAL MOLECULE DETECTION

(75) Inventors: Mineo Yamakawa, Campbell, CA (US); John Heck, Mountain View, CA (US); Selena Chan, Sunnyvale, CA (US); Narayan Sundararajan, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 729 days.

This patent is subject to a terminal disclaimer.

(21) Appl. No.: 10/856,372

(22) Filed: May 27, 2004

(65) Prior Publication Data
US 2004/0219072 A1    Nov. 4, 2004

Related U.S. Application Data

(63) Continuation of application No. 10/243,089, filed on Sep. 12, 2002, now Pat. No. 6,806,543.

(51) Int. Cl.
*B01L 3/00* (2006.01)
(52) U.S. Cl. ............ 422/400; 422/68.1; 422/82.05; 422/503; 324/76.11; 324/600; 436/150; 137/833; 257/414
(58) Field of Classification Search ........ 422/82.05, 422/82.09, 58; 435/287.1, 288.7, 808; 436/164, 436/177, 178; 204/450
See application file for complete search history.

(56) References Cited

U.S. PATENT DOCUMENTS

| 5,919,364 | A | 7/1999 | Lebouitz et al. ......... 210/321.84 |
| 5,961,932 | A * | 10/1999 | Ghosh et al. ................. 422/193 |
| 6,248,539 | B1 * | 6/2001 | Ghadiri et al. ................ 435/7.1 |
| 6,293,012 | B1 * | 9/2001 | Moles ....................... 29/890.124 |
| 6,321,791 | B1 | 11/2001 | Chow ............................ 137/833 |

(Continued)

FOREIGN PATENT DOCUMENTS

CN        1681596        10/2005
(Continued)

OTHER PUBLICATIONS

Chinese Office Action dated Nov. 17, 2006, directed to counterpart CN application No. 03820921.

*Primary Examiner* — In Suk Bullock
*Assistant Examiner* — Timothy G Kingan
(74) *Attorney, Agent, or Firm* — Pillsbury Winthrop Shaw Pittman LLP

(57) ABSTRACT

Microfluidic apparatus including integrated porous substrate/sensors that may be used for detecting targeted biological and chemical molecules and compounds. In one aspect, upper and lower microfluidic channels are defined in respective halves of a substrate, which are sandwiched around a porous membrane upon assembly. In other aspect, the upper and lower channels are formed such that a portion of the lower channel passes beneath a portion of the upper channel to form a cross-channel area, wherein the membrane is disposed between the two channels. In various embodiments, one or more porous membranes are disposed proximate to corresponding cross-channel areas defined by one or more upper and lower channels. The porous membrane may also have sensing characteristics, such that it produces a change in an optical and/or electronic characteristic. Accordingly, the apparatus may further include instrumentation or detection equipment to measure the changes, such as optic-based detectors and electronic instrumentation.

9 Claims, 10 Drawing Sheets

U.S. PATENT DOCUMENTS

| | | |
|---|---|---|
| 6,344,326 B1 | 2/2002 | Nelson et al. ............... 435/6 |
| 6,418,968 B1 * | 7/2002 | Pezzuto et al. ............ 137/833 |
| 6,447,661 B1 * | 9/2002 | Chow et al. ............... 204/453 |
| 6,673,596 B1 * | 1/2004 | Sayler et al. ............ 435/288.7 |
| 6,806,543 B2 * | 10/2004 | Yamakawa et al. ......... 257/414 |
| 2002/0113009 A1 | 8/2002 | O'Connor et al. ........... 210/511 |
| 2003/0094369 A1 * | 5/2003 | Tolley et al. ............... 204/450 |
| 2003/0104512 A1 * | 6/2003 | Freeman et al. ............. 435/29 |
| 2003/0136679 A1 * | 7/2003 | Bohn et al. ................ 204/543 |
| 2003/0148524 A1 * | 8/2003 | Zimmermann et al. ...... 435/470 |
| 2003/0180711 A1 * | 9/2003 | Turner et al. .................. 435/4 |
| 2004/0053422 A1 * | 3/2004 | Chan et al. ................ 436/180 |
| 2004/0115838 A1 * | 6/2004 | Quake et al. .............. 436/538 |
| 2004/0124147 A1 * | 7/2004 | Fissell et al. .............. 210/650 |
| 2004/0258571 A1 * | 12/2004 | Lee et al. .................. 422/100 |
| 2005/0014162 A1 * | 1/2005 | Barth et al. ................... 435/6 |
| 2005/0129580 A1 * | 6/2005 | Swinehart et al. .......... 422/100 |

FOREIGN PATENT DOCUMENTS

| | | |
|---|---|---|
| EP | 1157743 A1 | 11/2001 |
| EP | 1226871 | 7/2002 |
| WO | WO 99/19717 | 4/1999 |
| WO | WO 03 015890 * | 2/2003 |

* cited by examiner

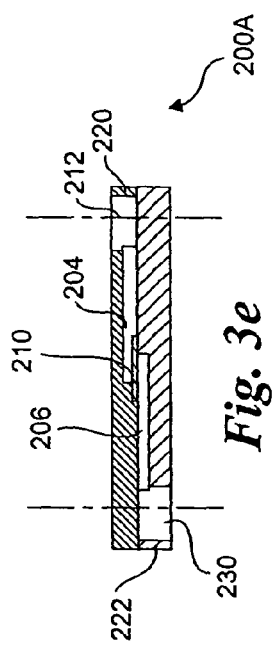
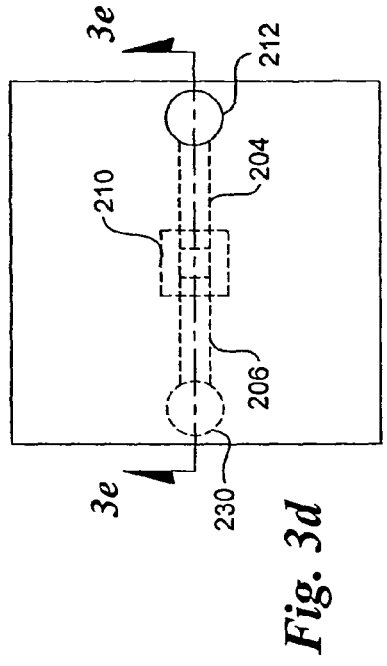
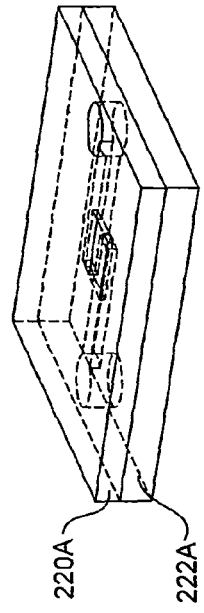
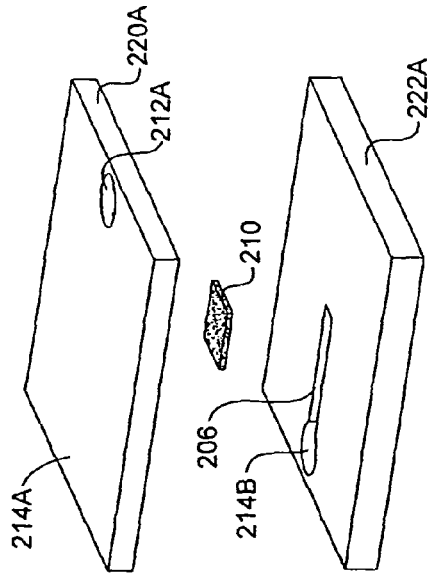
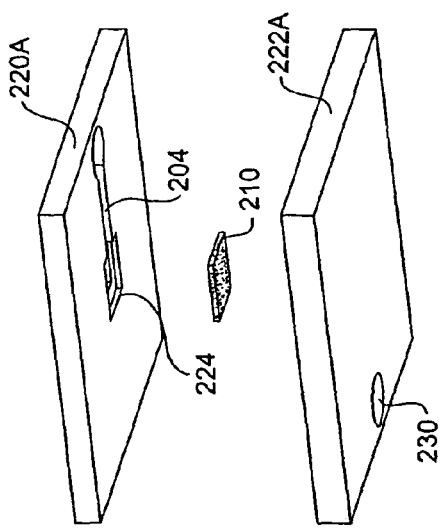

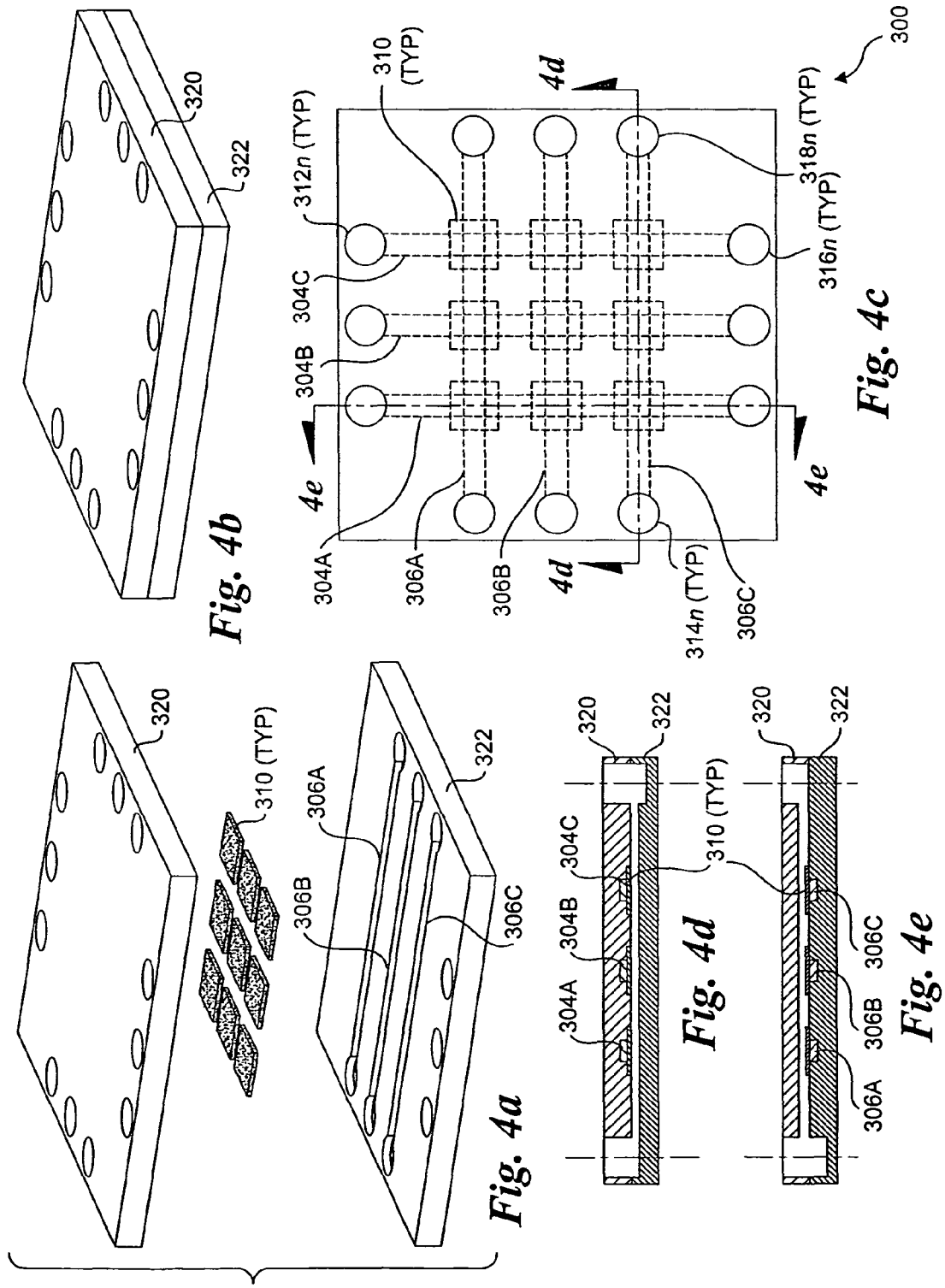

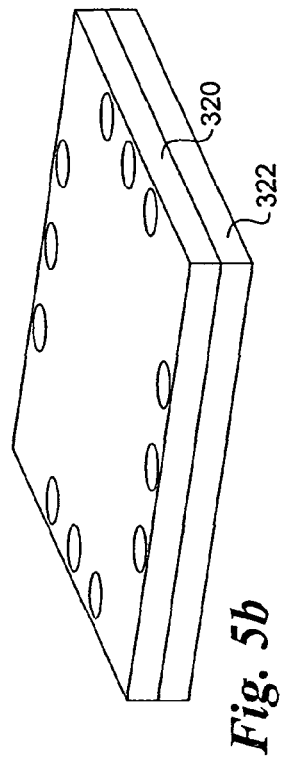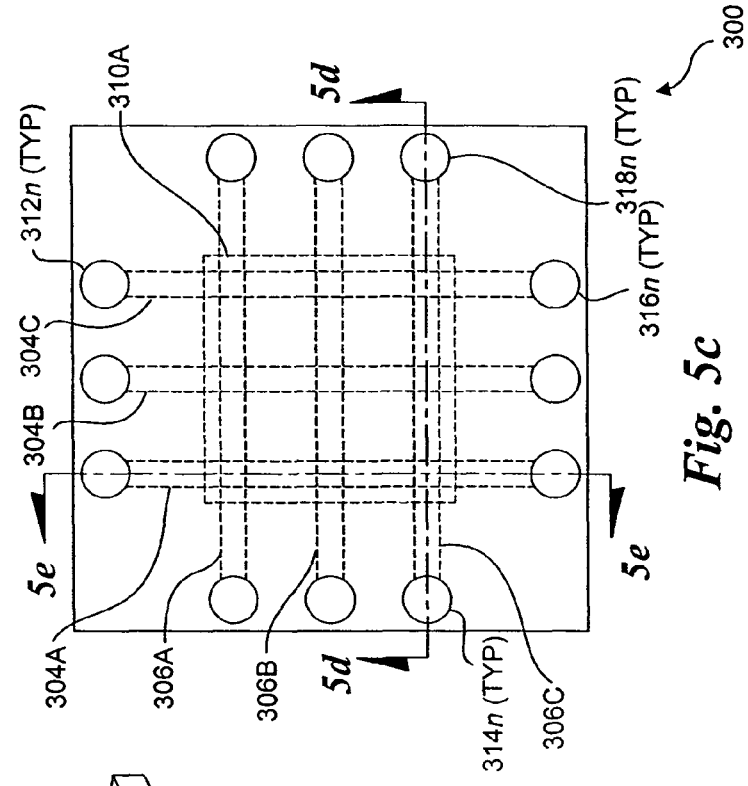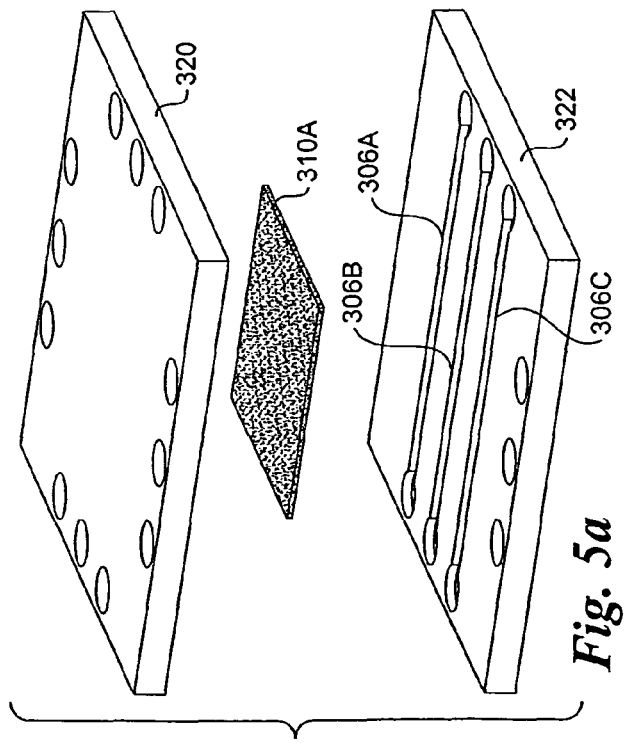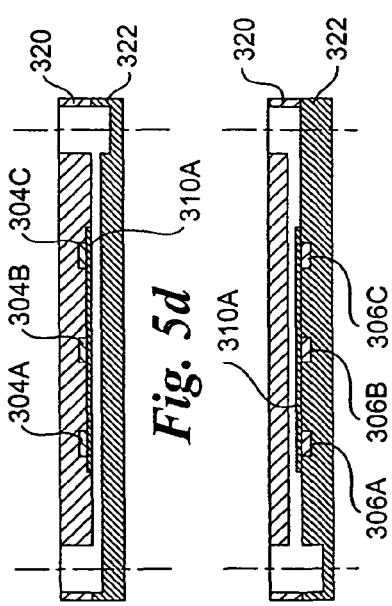
Fig. 5a
Fig. 5b
Fig. 5c
Fig. 5d
Fig. 5e

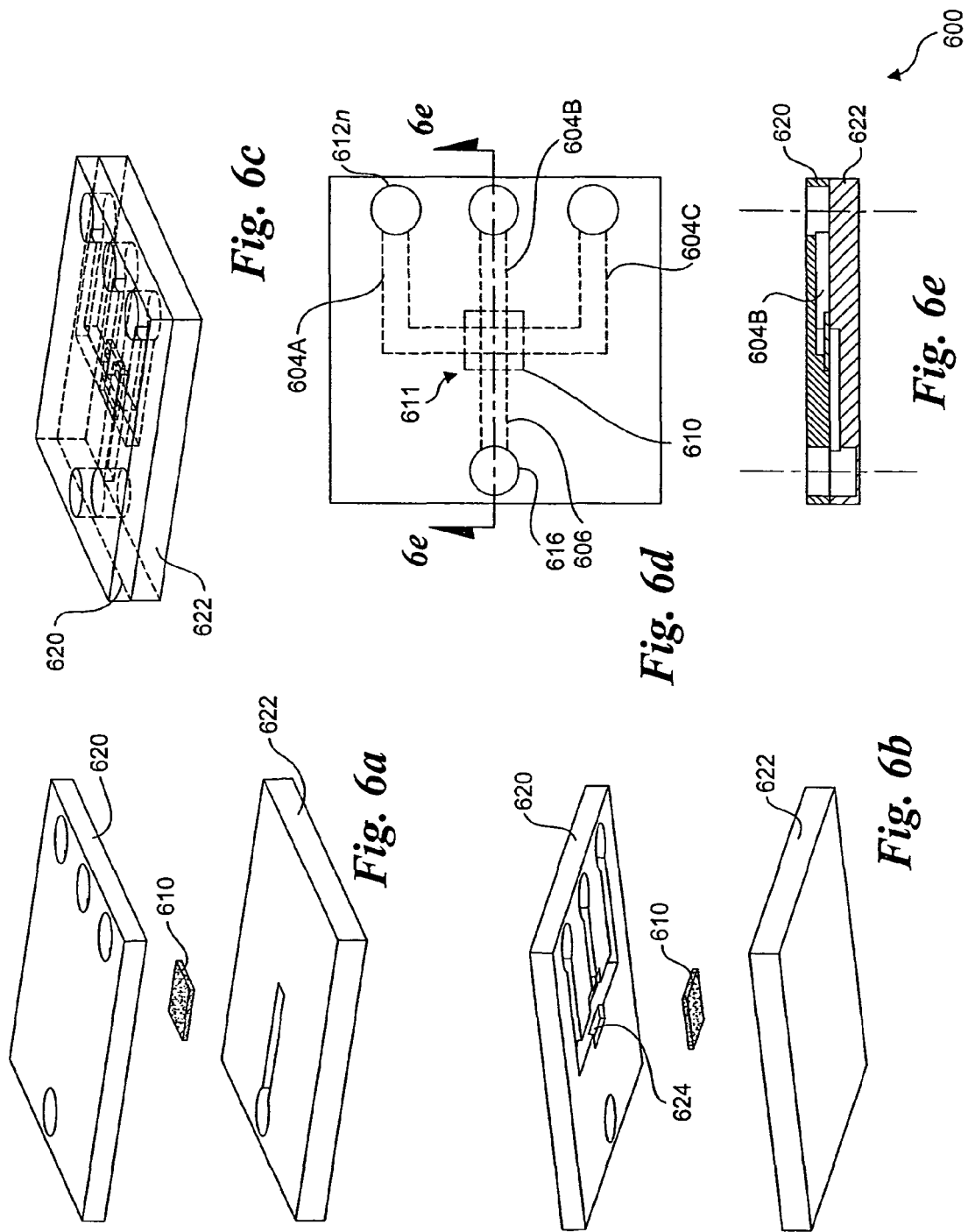

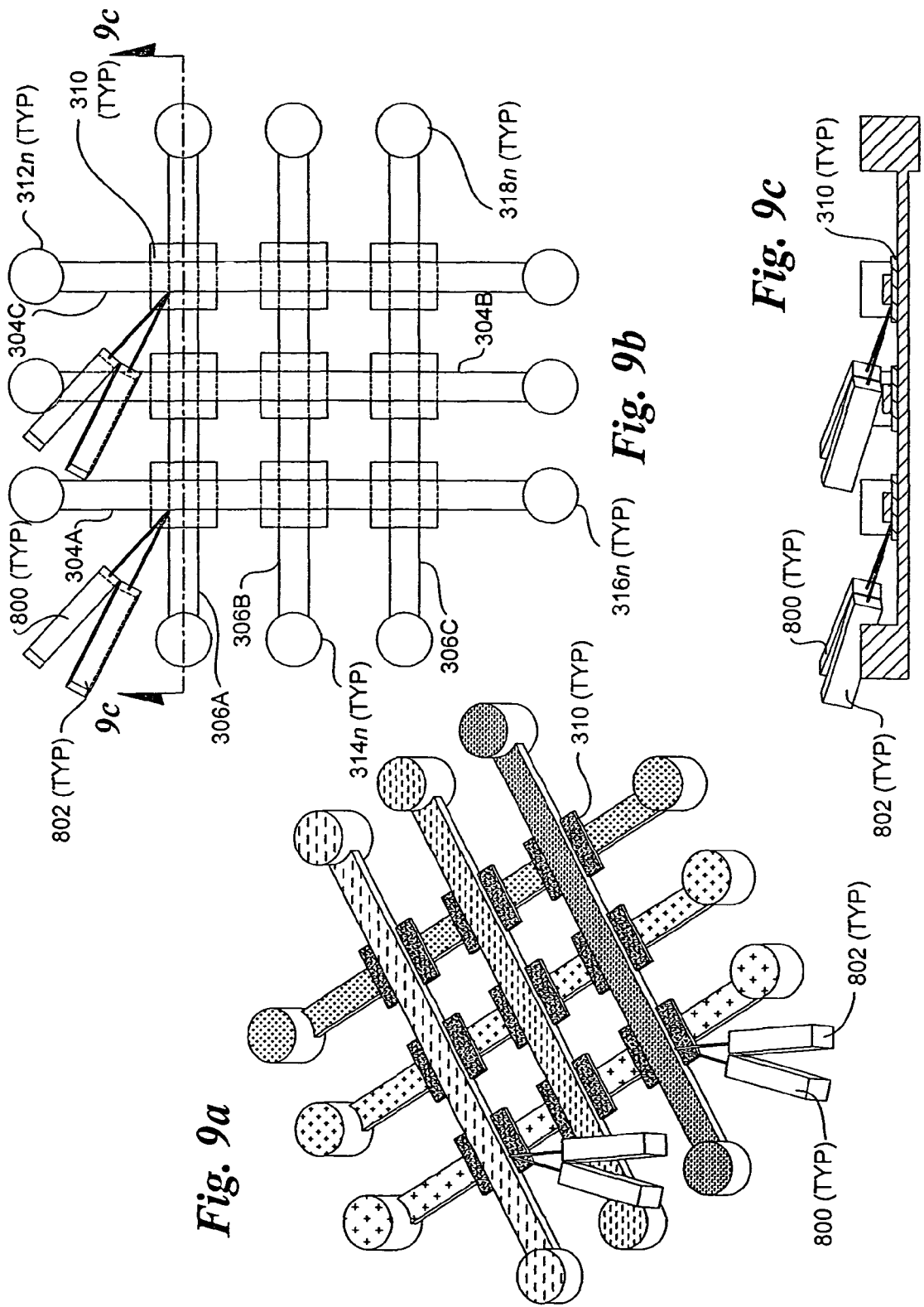

US 8,153,079 B2

MICROFLUIDIC APPARATUS WITH INTEGRATED POROUS-SUBSTRATE/SENSOR FOR REAL-TIME (BIO)CHEMICAL MOLECULE DETECTION

CROSS REFERENCE TO RELATED APPLICATIONS

This application is a continuation of U.S. application Ser. No. 10/243,089 filed Sep. 12, 2002, now U.S. Pat. No. 6,806,543. The disclosure of the prior application is considered part of and is incorporated by reference in the disclosure of this application.

BACKGROUND OF THE INVENTION

1. Field of the Invention

This disclosure relates generally to microfluidic devices, and more particularly, but not exclusively, to microfluidic devices having porous membranes with integrated sensors for filtering and detection of biological and/or chemical molecules.

2. Background Information

As the breadth of microchip fabrication technology has continued to expand, an emerging technology associated with miniscule gadgets known as microfluidic devices has taken shape. Microfluidic devices, often comprising miniaturized versions of reservoirs, pumps, valves, filters, mixers, reaction chambers, and a network of capillaries interconnecting the microscale components, are being developed to serve in a variety of deployment scenarios. For example, microfluidic devices may be designed to perform multiple reaction and analysis techniques in one micro-instrument by providing a capability to perform hundreds of operations (e.g. mixing, heating, separating) without manual intervention. In some cases, microfluidic devices may function as detectors for airborne toxins, rapid DNA analyzers for crime-scene investigators, and/or new pharmaceutical testers to expedite drug development.

Recently, researchers have shown that porous substrates, such as nanocrystalline silicon, can be manufactured to detect particular chemical and bio-molecular structures. For example, one of these researchers has developed a porous substrate that may be used to detect TNT and dinitrotoluene at the parts per billion (ppb) level (cf., chem-faculty.ucsd.edu/sailor).

While the applications of such microfluidic devices and sensing substrates may be virtually boundless, the integration of some microscale components into microfluidic systems has been technically difficult, thereby limiting the range of functions that may be accomplished by a single device or combination of devices. In particular, current microfluidic systems have not adequately integrated a size-separating (or excluding) filter into a microfluidic chip. As such, separations may generally be carried out in external packed porous media or polymer-based nanopore membranes, thereby increasing contamination risks and introducing additional complexity and manual interaction into the performance of an analysis or other technique. Furthermore, sensing substrates have also not been integrated into a chip or the like.

BRIEF DESCRIPTION OF THE DRAWINGS

In the drawings, like reference numerals refer to like parts throughout the various views of the non-limiting and non-exhaustive embodiments of the present invention, and wherein:

FIGS. 3$a$-$e$ are various views of a microfluidic device in accordance with an embodiment of the invention that is a modification of the embodiment shown in FIGS. 2$a$-$e$, wherein FIGS. 3$a$ and 3$b$ are exploded isometric views, FIG. 3$c$ is a isometric hidden line view, FIG. 3$d$ is a plan view including section cut 3$e$-3$e$7 and FIG. 3$e$ is a cross-section view corresponding to section cut 3$e$-3$e$;

FIGS. 4$a$-$e$ are various views of a microfluidic device in accordance with an embodiment of the invention in which an array of porous substrate/sensors are employed, wherein FIG. 4$a$ is an exploded isometric view, FIG. 4$b$ is an assembled isometric view, FIG. 4$c$ is a plan view including section cuts 4$d$-4$d$ and 4$e$-4$e$7 FIG. 4$d$ is a cross-section view corresponding to section cut 4$d$-4$d$, and FIG. 4$e$ is a cross-section view corresponding to section cut 4$e$-4$e$;

FIGS. 5$a$-$e$ are various views of a microfluidic device in accordance with an embodiment of the invention that is a variant of the embodiment of FIGS. 4$a$-$e$ in which a single porous substrate/sensor is employed, wherein FIG. 5$a$ is an exploded isometric view, FIG. 5$b$ is an assembled isometric view, FIG. 5$c$ is a plan view including section cuts 5$d$-5$d$ and 5$e$-5$e$, FIG. 5$d$ is a cross-section view corresponding to section cut 5$d$-5$d$, and FIG. 5$e$ is a cross-section view corresponding to section cut 5$e$-5$e$;

FIGS. 6$a$-$e$ are various views of a microfluidic device in accordance with an embodiment of the invention in which a plurality of upper channels meet at an intersection, wherein FIGS. 6$a$ and 6$b$ are exploded isometric views, FIG. 6$c$ is an isometric hidden line view, FIG. 6$d$ is a plan view including section cut 6$e$-6$e$, and FIG. 6$e$ is a cross-section view corresponding to section cut 6$e$-6$e$;

FIG. 7$b$ is a flowchart illustrating operations that may be used to fabricate a porous membrane in accordance with another embodiment of the invention;

FIGS. 9$a$-$c$ depict various views of optical sensing equipment implemented for detecting changes in an optical characteristic of a porous membrane/sensor corresponding to the embodiment of FIGS. 4$a$-$e$ wherein volumes internal to the substrate are shown.

DETAILED DESCRIPTION OF THE INVENTION

Figure 1F:
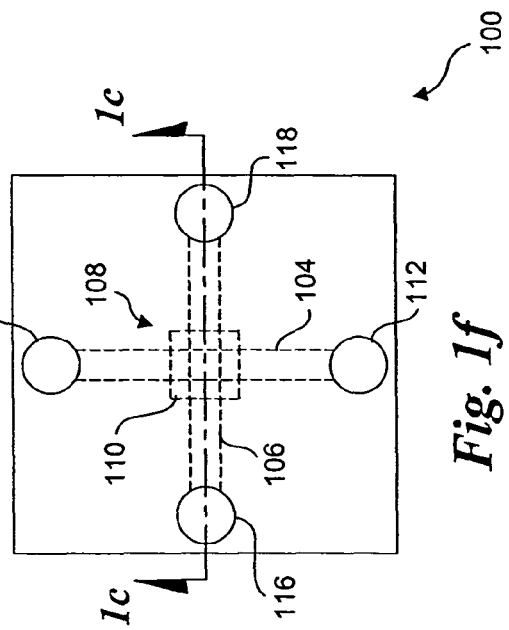
FIG. 1$a$-$f$ are various views of a microfluidic device in accordance with an embodiment of the invention, wherein FIGS. 1$a$ and 1$b$ are exploded isometric views, FIG. 1$c$ is a cross-section view corresponding to section cut 1$c$-1$c$, FIG. 1$d$ is a isometric hidden line view, FIG. 1$e$ is an isometric view including a composite section cut, and FIG. 1$f$ is a plan view including section cut 1$c$-1$c$.
Figure 1D:
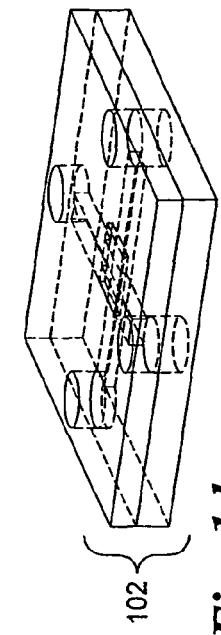

Embodiments of a microfluidic device with an integrated porous-silicon membrane for molecular sieving, metering, and separations, and methods for fabricating and using the same are described in detail herein. In the following description, numerous specific details are provided, s k h as the identification of various system components, to provide a thorough understanding of embodiments of the invention. One skilled in the art will recognize, however, that embodiments of the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, embodiments of the invention provide a microfluidic device with at least one integrated porous-silicon membrane to sieve, meter, and/or separate molecular components from an influent stream introduced into the microfluidic device. Other features of the illustrated embodiments will be apparent to the reader from the foregoing and the appended claims, and as the detailed description and discussion is read in conjunction with the accompanying drawings.

A microfluidic apparatus 100 in accordance with one embodiment of the invention is shown in FIGS. 1a-f. Microfluidic apparatus 100 includes a platform substrate 102 in which upper and lower microfluidic channels 104 and 106 are formed. The upper and lower microfluidic channels are oriented such that the upper channel crosses over the lower channel at a "cross-channel" area 108. A porous substrate 110 is disposed between the upper and lower channels proximate to this cross-channel area. As described below in further detail, the porous substrate 110 includes a plurality of pores through which molecular portions of some fluids, including liquids and gases, may pass, while restricting passage of other molecules.

In various embodiments, reservoirs may be connected to one or both ends of the upper channel and/or the lower channel. For example, in the illustrated embodiment, input and output reservoirs 112 and 114 are connected at respective input and output ends of upper channel 104, while input and output reservoirs 116 and 118 are connected at respective input and output ends of lower channel 106. In general, it will be desired to have liquid flow through each of the upper and lower channels in a particular direction. In consideration of this, in one embodiment the depth of the output reservoirs is extended below the channel depth. As a result, when fluid is added to the input reservoirs, it is caused to flow through the channels to the output reservoirs. In place of or in addition to the output reservoirs, respective exit paths for the upper and lower channels may also be provided (not shown).

Figure 1E:
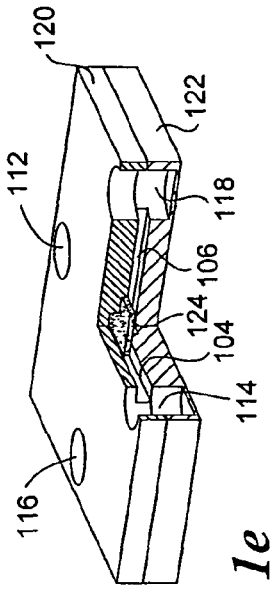
Figure 1A:
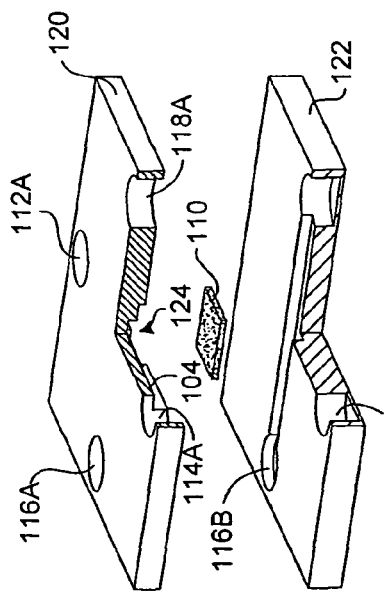
Figure 1B:
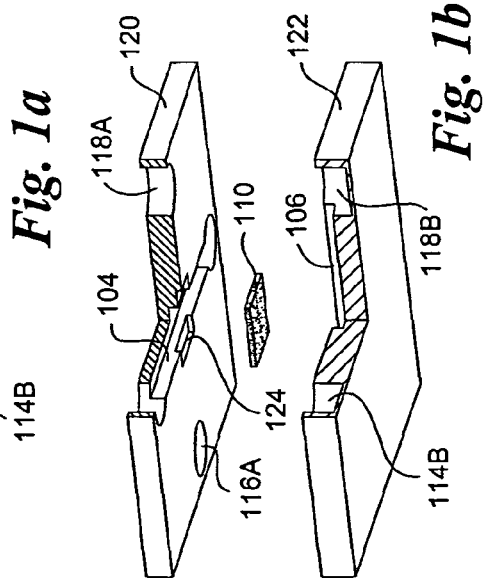
Figure 1C:
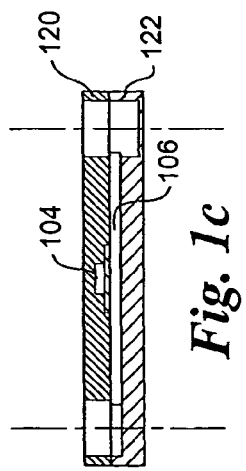
Figure 2E:
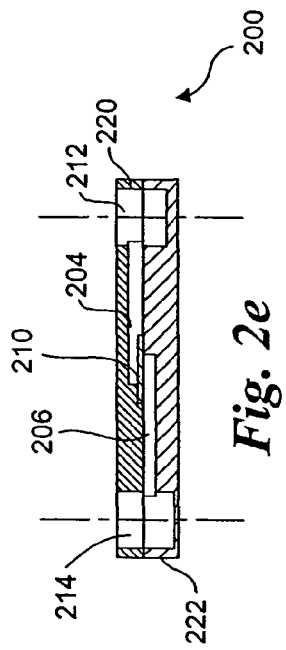
FIGS. 2$a$-$e$ are various views of a microfluidic device in accordance with an embodiment of the invention, wherein FIGS. 2$a$ and 2$b$ are exploded isometric views, FIG. 2$c$ is a isometric hidden line view, FIG. 2$d$ is a plan view including section cut 2$e$-2$e$7 and FIG. 2$e$ is a cross-section view corresponding to section cut 2$e$-2$e$.
Figure 2D:
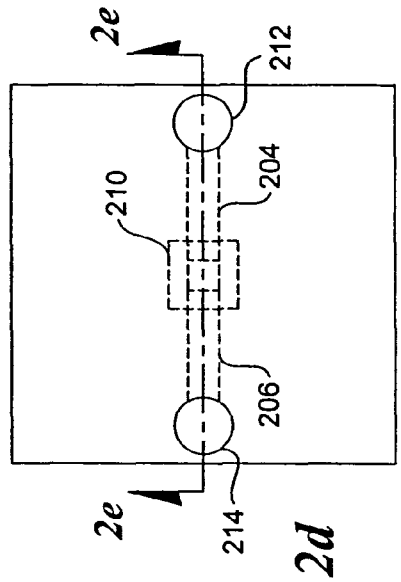
Figure 2C:
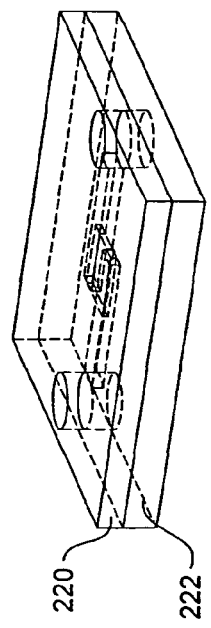
Figure 2A:
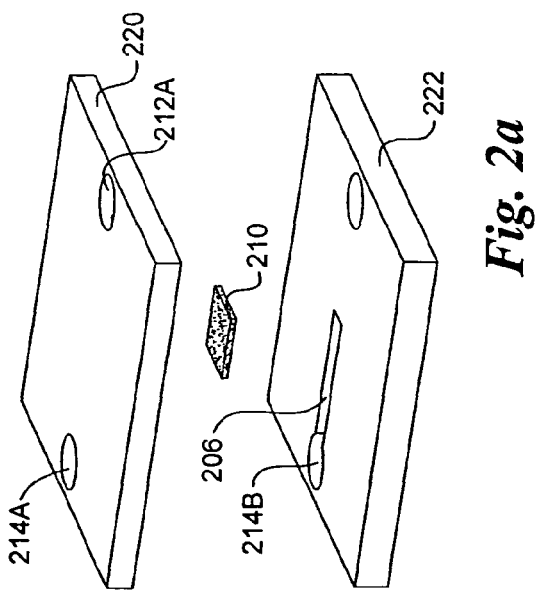
Figure 2B:
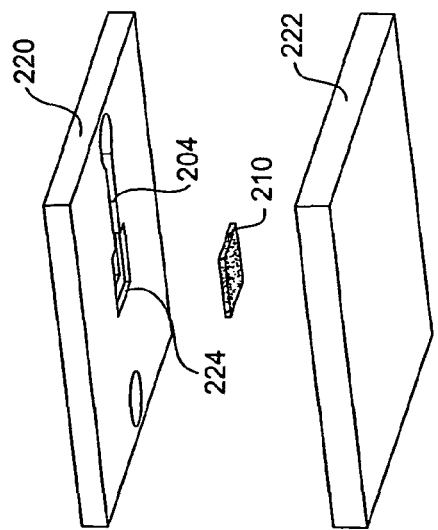

Generally, the platform substrate will comprise an upper and lower half, which are sandwiched around one or more porous membrane/sensors. For example, as shown in FIGS. 1E and 1F, the platform substrate includes an upper substrate member 120 and a lower substrate member 122. As shown in FIG. 1F, the upper microfluidic channel 104 is formed in the upper substrate member, while the lower microfluidic channel 106 is formed in the lower substrate. In one embodiment, lower portions 116B, 118B and 114B of input and output reservoirs 116 and 118 and output reservoir 114, respectively are formed in the lower substrate member, while corresponding through holes 112A, 114A, 116A and 118A are defined in the upper substrate member. In general, the upper and lower substrate members will be sandwiched around the porous membrane 110 upon assembly. Accordingly, a recess in which the porous membrane will be disposed upon assembly may be formed in either the upper or lower substrate member. For example, in the illustrated embodiment, a recess 124 is defined in upper substrate member 120.

An embodiment of a single "flow-through" microfluidic apparatus 200 is shown in FIG. 2a-e. In one implementation a first reactant fluid enters an input reservoir 212 and flows into upper channel 204. At the same time, a second reactant fluid enters an input/output reservoir 214 and flows into a lower channel 206. Portions of the first and second reactants then pass through the pores in a porous membrane 210 and mix to produce a reaction. In a manner similar to that discussed above, in response to certain chemical reactions, the porous membrane may change an optical or electrical characteristic, thereby enabling the chemical reaction to be sensed.

In another implementation of the embodiment illustrated in FIGS. 2a-e, a single fluid is input into input reservoir 212 and flows into upper channel 204. A portion of the fluid then passes through porous membrane 210 and into lower channel 206. The portion of the fluid passing through the porous membrane may then be collected in input/output reservoir 214. In this embodiment, the fluid may cause a change in an optical and/or electrical characteristic of the porous membrane in a similar manner to that discussed above.

In one embodiment, microfluidic apparatus 200 comprises a three-part assembly, including an upper substrate member 220, and a lower substrate member 222, which are sandwiched around porous membrane 210. As before, a recess may be formed in either the upper or lower substrate member to receive the porous membrane, such as a recess 224 formed in upper substrate member 220.

A microfluidic apparatus 200A having a configuration substantially similar to microfluidic apparatus 200 is shown in FIGS. 3a-e. The primary difference between the two apparatus' is that microfluidic apparatus 200A includes an exit port 230 rather than an input/output reservoir 214. Modifications to accommodate this change are shown in upper and lower substrate members 220A and 222A.

A microfluidic apparatus 300 in accordance with another embodiment of the invention is shown in FIGS. 4a-e. Microfluidic apparatus 300 includes a plurality of upper channels 304A, 304B, and 304C formed in an upper substrate member 320 and a plurality of lower microfluidic channels 306A, 306B, and 306C formed in a lower substrate member 322. Optionally, a plurality of input reservoirs 312n (a-c) and 316n and output reservoirs 314n and 318n may also be provided. In one embodiment, a plurality of porous membranes 310 are disposed within respective recesses (not shown) in upper substrate member 320 in a manner similar to that described above. In another embodiment, a single porous membrane 310A may be used, as shown in a microfluidic apparatus 500A shown in FIGS. 5a-e. As yet another option, the single porous membrane may be fabricated to include a plurality of porous sections, such as square or rectangular sections configured in an array (not shown).

A microfluidic apparatus 600 in accordance with another embodiment of the invention is shown in FIGS. 6a-e. The apparatus includes an upper substrate member 622 in which three upper channels 604A, 604B, and 604C are formed. Option & input reservoirs 112 are disposed at the input ends of each of channels 604A-C, while the output ends of the channels meet at an intersection 611. The apparatus further includes a lower substrate member 622 in which a lower lower microfluidic channel 606 is formed, wherein the lower substrate is similar in configuration with lower substrate member 164 for microfluidic apparatus 150. An output reservoir 616 may also be provided to collect fluids exiting the lower microfluidic channel. The apparatus further includes a porous membrane 610 disposed within a recess 624 formed in upper substrate member 620, wherein the recess is located proximate to intersection 611.

Microfluidic apparatus 600 will typically be used in the following manner, Respective fluid reactants will be received at the input ends of the upper microfluidic channels 604 (e.g., via input reservoirs 612A-C). The fluid reactants will then merge at intersection 611, causing a chemical reaction. A portion of the reactant chemical compound thereby formed will flow into the pores in porous membrane 610, thereby causing a potential change in an optical and/or electrical characteristic of the porous membrane. Such a characteristic change may be measured in the manners described below.

Porous Membrane Manufacture and Characteristics

In accordance with one aspect, the porous membrane comprises a porous structure that may be used for filtering, metering, and/or separating chemical and/or biological molecules. In general, a porous membrane may be manufactured such that its porosity is greatest along a selected direction. Furthermore, through the manufacturing process described below, the pore sizes can be tuned from a few nanometers to micrometers, thereby enabling the filtration, metering and separation of targeted chemical and biological molecules.

In general, the porous membranes and porous membrane/sensors may be made from a wide-range of materials in which nano- and micro-porous structures may be formed. For example, such materials include but are not limited to single crystal porous silicon (PSi), porous polysilicon (PPSi), porous silica, zeolites, photoresists, porous crystals/aggregates, etc. Typically, the porous membranes will be used for molecular separation and/or molecular (bio)reaction media with built-in real-time detection/monitoring of processes, molecules, fluids, reaction states, etc.

In one embodiment, porous silicon is used for the porous membrane. Porous silicon is a well-characterized material produced through galvanostatic, chemical, or photochemical etching procedures in the presence of HF (hydrofluoric acid) (A. G. Cullis et al., J. Appl. Phys. 1997, 82, 909). Porous silicon can be made generally as complex, anisotropic nanocrystalline structure in silicon layers (cf., chem-faculty.ucsd.edu/sailor) by either electrochemical etching or stain etching to form porous silicon. The size and orientation of the pores can be controlled by the etching conditions (e.g., current density, etc.) and substrate type and its electrochemical properties (R. L. Smith, et al. "*Porous silicon formation mechanisms*", J. Appl. Phys., 1992, 71, R1; P. M. Fauchet, "*Pits and Pores: Formation, Properties, and Significance for Advanced Luminescent Materials*", P. Schmuki, et al., eds. Pennington, N.J.: *Electrochem. Soc.*, 1997, 27). Typical pore sizes range from ~50 angstrom to ~10 µm with high aspect ration (~250) pores in silicon maintained over a distance of several millimeters.

Another type of porous silicon can be formed by spark erosion (R. E. Hummel, et al., "*On the origin of photoluminescence in spark-eroded(porous) silicon*," *Appl. Phys. Lett.*, 1993, 63, 2771), resulting in a Si surface with pits and hills of various sizes in the micrometer to nanometers scale. Si nanostructures can be produced by an anisotopic etch followed by oxidation (A. G. Nassiopoulos, et al., "*Light emission form silicon nanostructures produced by conventional lithographic and reactive ion etching techniques*," *Phys. Stat. Sol.* (B), 1995, 1990, 91; S. H. Zaidi, et al., "*Scalable fabrication and optical characterization of nm Si structures*," In *Proc. Symp. Mater. Res. Soc.*, 1995, 358, 957). Through oxidizing a microcrystalline film deposited by chemical-vapor deposition, Si crystallites are passivated by SiO to form nanocrystalline structures (H. Tamura, et al., "*Origin of the green/blue luminescence from nanocrystalline silicon*," *Appl. Phys. Lett.*, 1994, 65, 92).

Figure 7A:
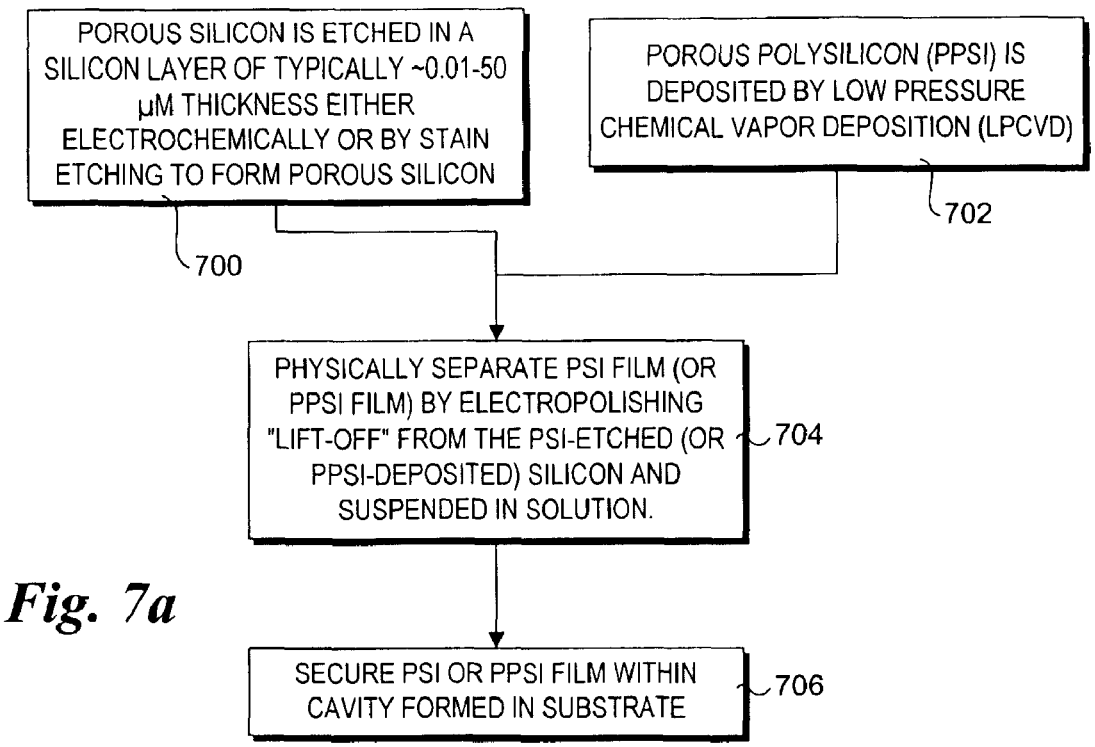
FIG. 7$a$ is a flow chart illustrating operations that may be used to fabricate a porous membrane in accordance with one embodiment of the invention.

With reference to the flowchart of FIG. 7a, a process for manufacturing porous membrane N10 (e.g., 110, 310, etc.) in accordance with one embodiment of the invention proceeds as follows. First, in a block 700, porous silicon is etched in a silicon layer of typically ~0.01-50 µm thickness either electrochemically or by stain etching to form porous silicon. In another embodiment, porous polysilicon (PPSi) is deposited by low-pressure chemical vapor deposition (LPCVD), in accordance with a block 702. The size and orientation of the pores, porosity, grain size, thickness, etc., may be controlled via appropriate etching conditions (e.g., current density, current duration, etc.), deposition conditions (e.g., temperature, pressure, etc.), and also substrate type and its electrochemical properties, etc.

Next, in a block 704, a PSi film (or PPSi film) is physically separated by electropolishing "lift-off" from the PSi-etched or PPSi-deposited silicon and suspended in solution. Alternately, PPSi film may be formed when directly deposited on a substrate (e.g., silicon, quartz, etc.), and can be physically separated by any of various standard etching or micromachining techniques. The PSi or PPSi film is then secured within a corresponding recess formed in a substrate half proximate to a cross-channel area in a block 706.

Figure 7B:
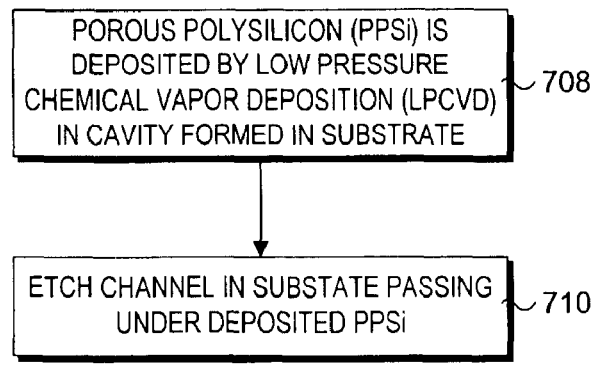
Figures 8A, 8B, 8C:
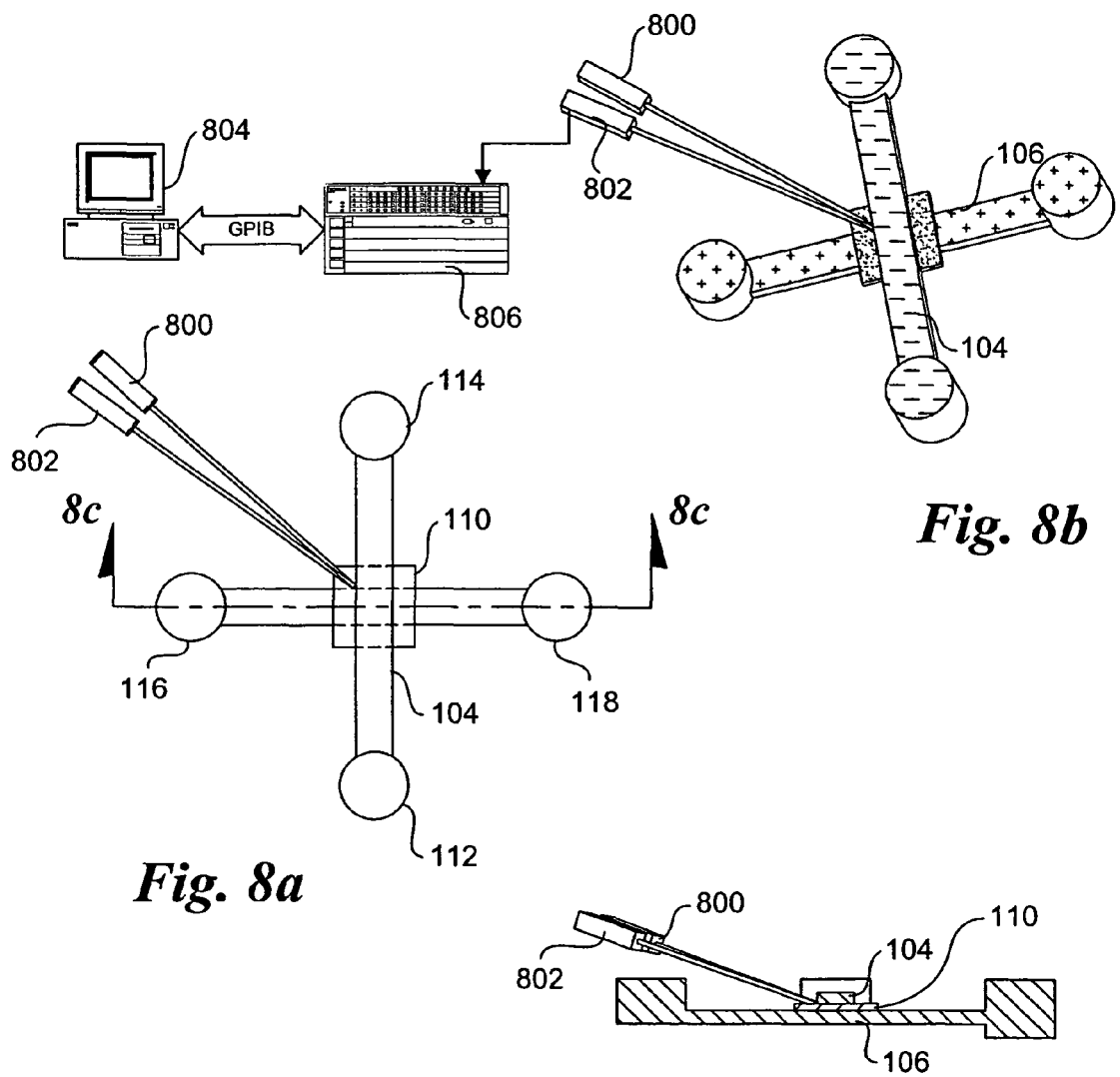
FIGS. 8$a$-$c$ depict various views of optical sensing equipment implemented for detecting changes in an optical characteristic of a porous membrane/sensor corresponding to the embodiment of FIGS. 1$a$-$f$, wherein volumes internal to the substrate are shown.

In an alternate process shown in FIG. 7b, PPSi is directly deposited over the substrate cavity using LPCVD to from the porous membrane in a block 708. Subsequently, in a block 710 a channel is etched in the substrate having a portion that passes under the deposited PPsi. Generally, the substrate may comprise any suitable material in which the microfluidic channels may be formed (e.g., silicon, quartz, polydimethyl siloxane (PDMS), SU-8 photoresists), and polymers such as polymethylmethacrylate (PMMA), etc.)

Real-Time Detection Of Biological and Chemical Molecules/Compounds

As discussed above, in various embodiments the porous membrane may also be manufactured such that it may be used as a sensor in addition to its filtering/sieving/molecular separation capability. For example, the porous membrane may be manufactured to produce a changed optical and/or electrical characteristic in response to being exposed to a targeted fluid or reaction, either through use of the base substrate material (e.g., PSi or PPSi), or through the addition of a sensor layer or through chemical doping and the like. Generally, such PSi or PPSi sensor mechanisms may include but are not limited to optical interferometric reflectivity, capacitance modulation, photoluminescence, optical form birefringence, acoustic, etc.

In one embodiment, optical changes may be observed by means of light source 800 and optical detector 802, as shown in FIGS. 8a-c and 9a-c. (It is noted in these Figures only the volumes occupied by the reactant fluids, also commonly referred to solutes and analytes, and are shown, for clarity. Furthermore, the sizes of the various components are not drawn to scale for clarity. Additionally, the dashes and crosses represent different chemical or biological compounds used for the reactions, wherein different cross-hatch densities and patterns depict different compounds). In general, light source 800 may comprise any device that produces light suitable for detecting a change in a light characteristic of the porous membrane/sensor in combination with corresponding optical detection equipment or devices. For example, in one embodiment light source 800 comprises a laser source that produces light at a specific wavelength.

Depending on the particular optical characteristics of the porous membrane/sensor, visible or invisible light may be used. For visible light wavelengths, in one embodiment at least one of the upper and lower substrates is visibly transparent, meaning the substrate(s) produces minimal attenuation of visible light. In some instances, it may be desirable to use light having a wavelength in the non-visible spectrum (infra-red) if exists. Many substrate materials are "optically translucent" to these wavelengths, meaning these materials enable light having certain non-visible wavelengths to pass through with minimal attenuation. As an option, various viewing hole configuration may be defined in substrates that are opaque to light having a wavelength that may be used to detect the change in the optical characteristic of the porous membrane (not shown).

Generally, a variety of optical detectors may be employed, depending on the particular optical characteristic to be observed. In one embodiment, the optical detector comprises a detector suitable for laser interferometry. Other typical optical detector include but are not limited to avalanche photodiodes, various photosensors, and other devices used to measure wavelength, phase shift, and or optical energy/power.

Typically, the optical detector may either include build-in data logging facilities, or external data logging equipment may be connected to the optical detector, such as depicted by a data logger 804. As another option, a computer 806 with a data-logging card or an electronic instrument interface, such as the GPIB (General Purpose Instrumentation Bus) interface may be used. The data logger may store the data locally, or on a computer network, such as in a data store hosted by a database or data system or storage area network (SAN) device.

Figure 10:
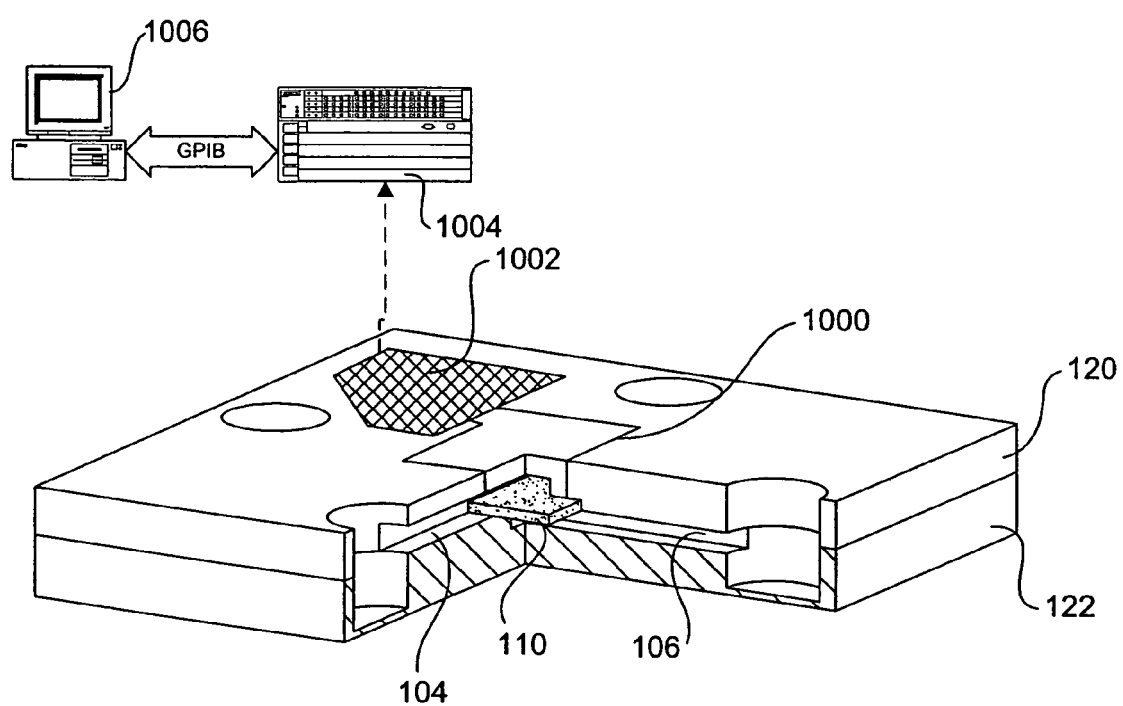
FIG. 10 is a schematic diagram illustrating an embodiment of the invention for detecting changes in an electrical characteristic of a porous membrane/substrate.

For changes in an electrical characteristic, various electronic instrumentation and/or circuits may be electrically coupled to the porous membrane to sense the changed condition. As discussed above, this may be facilitated by microelectrical traces disposed in the substrate, such as depicted by microelectronic traces 1000 in FIG. 10. Optionally, the substrate may be directly wired to external circuitry and/or electrical equipment, such as via wire bonding and the like. In one embodiment, signal conditioning and/or test measurement circuitry may be fabricated directly in the platform substrate, as is common in the semiconductor manufacturing arts, as depicted by integrated circuit 1002. Optionally, such signal conditioning and test measurement circuitry may be provided in an electronic measurement device 1006 and/or computer 1006.

Generally, the size of the channels and the cross-channel reactant area occupied by the porous membrane may be adjusted for the various reactants used in the testing. The flow of the fluids and molecules can be generated by standard microfluidics methods such as hydrostatic pressure, hydrodynamic, electrokinetic, electroosmotic, hydromagnetic, acoustic and ultrasound, mechanical, electrical field induced, heat-induced and other know methods. The flow-through micro-channel configurations (such as shown in FIGS. 1*a-f*, 4*a-e*, and 5*a-e*) allow flow-rate control, fluid dilutions, effective wash-out of the channels, minimum back-flow. Optionally, the flow may be blocked for incubations, diffusions, dilutions, etc., using standard microfluidic components and devices. For non-flow through micro-channel configurations, such as shown in FIGS. 2*a-e*, 3*a-e*, and 6*a-e*, the number of inlets and outlets and size of the cross-channel area can be varied based on functional requirements, reactant behaviors, etc. Furthermore, massively parallel configurations in accordance with the principles illustrated by the embodiments of FIGS. 4*a-e* and 5*a-e* may be manufactured and employed for testing. In such instance, the porous membrane at each cross channel may have the same or different functionality (optical, biochemical, electrical, acoustic, etc.) as a sensor/detector, molecular separation or sieving filter, bioreactor (with surface modified nanopores, nanopores with immobilized biomolecules, surface coated nanopores, etc.)

While the invention is described and illustrated here in the context of a limited number of embodiments, the invention may be embodied in many forms without departing from the spirit of the essential characteristics of the invention. The illustrated and described embodiments, including what is described in the abstract of the disclosure, are therefore to be considered in all respects as illustrative and not restrictive. The scope of the invention is indicated by the appended claims rather than by the foregoing description, and all changes that come within the meaning and range of equivalency of the claims are intended to be embraced therein.

What is claimed is:

1. An apparatus, comprising a microfluidic chip comprising a first substrate member having at least one first microfluidic channel passing through the first substrate member along a first direction; a second substrate member having at least one second microfluidic channel, passing through the second substrate member along a second direction; wherein a portion of the second microfluidic channel passes beneath a portion of the first microfluidic channel to form a crosschannel area; and at least one porous membrane disposed and sandwiched between the first and second substrate members proximate to the cross-channel area to form a semi-permeable barrier between the first and second microfluidic channels, wherein the at least one porous membrane is disposed in a recess formed in either the first substrate member or the second substrate member and wherein the porous membrane comprises porous nanocrystalline silicon or porous polysilicon, wherein the porous membrane exhibits sensing characteristics causing a change in an electrical characteristic of the porous membrane in response to exposure to a targeted fluid or reaction, wherein the porous membrane is integrated into the microfluidic chip, and wherein at least the first substrate member comprises electronic instrumentation configured to determine the change in the electrical characteristic.

2. The apparatus of claim 1, wherein the at least one second microfluidic channel comprises a plurality of channels, and the plurality of cross-channel areas are substantially configured in an array.

3. The apparatus of claim 1, wherein the at least one porous membrane comprise a plurality of porous membranes, each respectively disposed proximate to a respective cross-channel area.

4. The apparatus of claim 1, further comprising respective reservoirs defined in at least one of the first and second substrate members at opposing ends of at least one of the first and second microfluidic channels.

5. The apparatus of claim 1, wherein the first substrate member further includes microelectronic traces operatively coupled to the porous membrane.

6. The apparatus of claim 5, the electronic instrumentation is coupled to the porous membrane via the microelectronic traces.

7. The apparatus of claim 1, wherein the first and second substrate members comprise one of a polydimethyl siloxane (PDMS), silicon, quartz, polymer, or polymethylmethacrylate (PMMA) substrate.

8. The apparatus of claim 1, wherein the first substrate member comprises an integrated circuit.

9. The apparatus of claim 1, wherein the first microfluidic channel and the second microfluidic channel are functional to have liquid flow therethrough.

* * * * *